US012567688B2

(12) United States Patent
Jürgens

(10) Patent No.: US 12,567,688 B2
(45) Date of Patent: Mar. 3, 2026

(54) ELECTRONICS HOUSING FOR AUTOMATED ASSEMBLY

(71) Applicant: Continental Teves AG & Co. OHG, Frankfurt am Main (DE)

(72) Inventor: Michael Jürgens, Wölfersheim (DE)

(73) Assignee: CONTINENTAL TEVES AG & CO. OHG, Frankfurt am Main (DE)

( * ) Notice: Subject to any disclaimer, the term of this patent is extended or adjusted under 35 U.S.C. 154(b) by 528 days.

(21) Appl. No.: 17/779,962

(22) PCT Filed: Nov. 19, 2020

(86) PCT No.: PCT/EP2020/082762
§ 371 (c)(1),
(2) Date: May 25, 2022

(87) PCT Pub. No.: WO2021/105002
PCT Pub. Date: Jun. 3, 2021

(65) Prior Publication Data
US 2023/0006373 A1 Jan. 5, 2023

(30) Foreign Application Priority Data
Nov. 25, 2019 (DE) ..................... 10 2019 218 205.4

(51) Int. Cl.
*H01R 12/58* (2011.01)
*H01R 13/516* (2006.01)
*H05K 7/14* (2006.01)

(52) U.S. Cl.
CPC ......... *H01R 12/585* (2013.01); *H01R 13/516* (2013.01); *H05K 7/142* (2013.01)

(58) Field of Classification Search
CPC .............. H01R 13/6471; H01R 12/716; H01R 13/6582; H01R 13/6587; H01R 24/50
See application file for complete search history.

(56) References Cited

U.S. PATENT DOCUMENTS 4,762,500 A * 8/1988 Dola .................. H01R 13/6585
439/83
4,826,791 A * 5/1989 Mehrotra .............. C04B 35/597
501/88

(Continued)

FOREIGN PATENT DOCUMENTS

CN 203369050 12/2013
DE 8604445 U1 7/1987

(Continued)

OTHER PUBLICATIONS

Office action dated Nov. 18, 2023 of counterpart KR application No. 10-2022-7015582.

(Continued)

*Primary Examiner* — Truc T Nguyen

(57) ABSTRACT

An electronics housing for accommodating and making electrical contact with a printed circuit board has at least one signal contact for connection to the printed circuit board, which is in the form of a press-in contact, and at least two power contacts for electrical connection to the printed circuit board, which are in the form of press-in contacts and have a width that is greater than the width of the at least one signal contact. The at least two power contacts are longer than the at least one signal contact for easier assembly with the printed circuit board.

11 Claims, 4 Drawing Sheets

(56) References Cited

U.S. PATENT DOCUMENTS

| | | | | |
|---|---|---|---|---|
| 4,836,791 | A * | 6/1989 | Grabbe | H01R 12/00 |
| | | | | 439/95 |
| 6,524,117 | B1 | 2/2003 | Murakami | |
| 2002/0048995 | A1* | 4/2002 | Shindo | H01R 13/6585 |
| | | | | 439/607.07 |
| 2004/0043646 | A1 | 3/2004 | Takeuchi | |
| 2005/0277312 | A1 | 12/2005 | Nakamura | |
| 2007/0155255 | A1* | 7/2007 | Galauner | H01R 4/18 |
| | | | | 361/823 |
| 2007/0161287 | A1* | 7/2007 | Yamauchi | H05K 3/301 |
| | | | | 439/567 |
| 2008/0158830 | A1* | 7/2008 | Tominaga | H05K 7/20854 |
| | | | | 361/722 |
| 2008/0176452 | A1 | 7/2008 | Fedder et al. | |
| 2009/0250998 | A1 | 10/2009 | Hinz et al. | |
| 2010/0255722 | A1* | 10/2010 | Sander | H01R 12/585 |
| | | | | 439/587 |
| 2011/0009011 | A1* | 1/2011 | Johnescu | H01R 13/6477 |
| | | | | 29/874 |
| 2011/0039428 | A1 | 2/2011 | Ludwig | |
| 2011/0201216 | A1* | 8/2011 | Miyamoto | H01R 4/028 |
| | | | | 439/83 |
| 2012/0220170 | A1* | 8/2012 | Pan | H01R 12/585 |
| | | | | 439/660 |
| 2013/0316551 | A1* | 11/2013 | Day, Jr. | H05K 3/325 |
| | | | | 439/84 |
| 2014/0346318 | A1 | 11/2014 | Hardegger et al. | |
| 2016/0262266 | A1* | 9/2016 | Matsumoto | H05K 5/0026 |
| 2018/0076549 | A1 | 3/2018 | Chen | |
| 2019/0306998 | A1* | 10/2019 | Malecke | H01R 13/518 |

FOREIGN PATENT DOCUMENTS

| | | | |
|---|---|---|---|
| DE | 8713091 | U1 | 12/1987 |
| DE | 102005023837 | A1 | 12/2006 |
| DE | 102008023457 | A1 | 5/2009 |
| DE | 102008004882 | A1 | 7/2009 |
| DE | 102012103203 | A1 | 10/2013 |
| DE | 102013214621 | A1 | 1/2015 |
| DE | 102016212258 | A1 | 1/2018 |
| JP | 4939634 | B2 | 9/2010 |
| KR | 20060049217 | A | 5/2006 |
| WO | 2015010946 | A1 | 1/2015 |

OTHER PUBLICATIONS

German Search Report dated Sep. 10, 2020 for the counterpart German Patent Application No. 10 2019 218 205.5.

The International Search Report and the Written Opinion of the International Searching Authority mailed on Feb. 22, 2021 for the counterpart PCT Application No. PCT/EP2020/082762.

Chinese First Office Action dated Apr. 13, 2023 for the counterpart Chinese Patent Application No. 202080080738.3 and DeepL translation of same.

Chinese Second Office Action dated Aug. 14, 2023 for the counterpart Chinese Patent Application No. 202080080738.3 and DeepL translation of same.

Korean Office Action dated Sep. 23, 2024 for the counterpart Koren Patent Application No. 10 2022 7015582 and machine translation of same.

European Examination Report dated Jun. 6, 2024 for the counterpart European Patent Application No. 20 811 268.0 and machine translation of same.

* cited by examiner

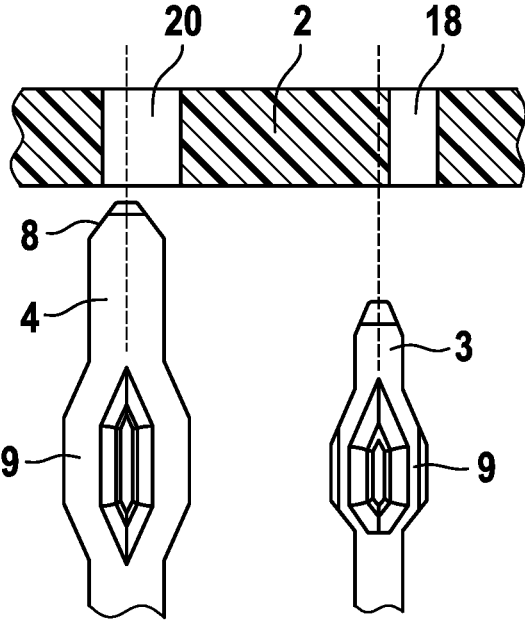
Fig. 3
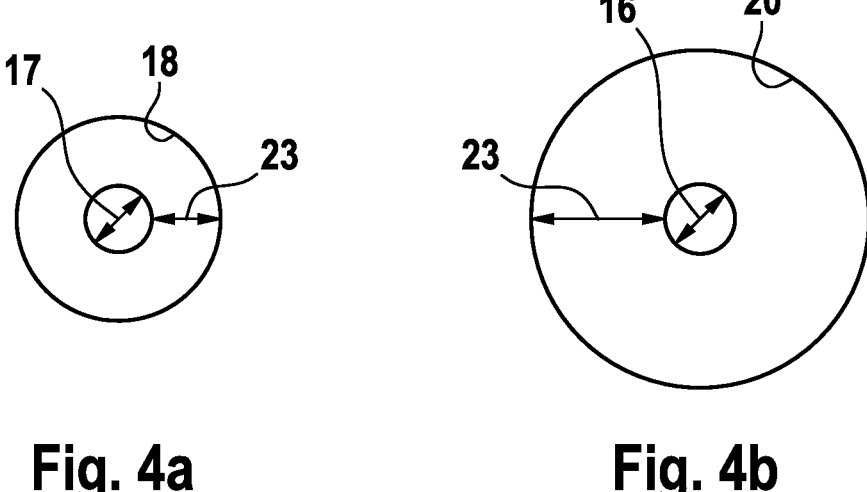
Fig. 4a              Fig. 4b

ELECTRONICS HOUSING FOR AUTOMATED ASSEMBLY

CROSS-REFERENCE TO RELATED APPLICATION

This U.S. patent application claims the benefit of PCT patent application No. PCT/EP2020/082762, filed Nov. 19, 2020, which claims the benefit of German patent application No. 10 2019 218 205.4, filed Nov. 19, 2019, both of which are hereby incorporated by reference.

TECHNICAL FIELD

The invention relates to an electronics housing for accommodating and making electrical contact with a printed circuit board, to an electronic unit having such an electronics housing and a printed circuit board, and to a method for assembling such an electronic unit.

BACKGROUND

The production of electronic units such as for example electronic control units (ECU), in particular the production of large electronic control units, involves printed circuit boards with the associated electrical circuits being manually inserted into an applicable electronics housing, which is typically made of plastic. For the electrical connection of the printed circuit board to the electronics housing, the electronics housing has multiple electrical contacts in the form of contact pins, flat contacts or the like, which need to be accommodated in corresponding holes or recesses in the printed circuit board. These electrical contacts are typically in the form of press-in contacts, i.e. they have a region whose width matches the width of the hole or recess in the printed circuit board in such a way that the electrical contact touches the walls of the holes or recesses, with the result that an electrical connection is made between the printed circuit board and the electrical contact. Depending on requirements, an electronic unit has electrical contacts having different widths. Signal contacts, which have a smaller width, may be used for smaller currents, whereas power contacts, which have a larger width than the signal contacts, may be used for larger currents.

Since such an electronic unit typically has a multiplicity of such signal contacts and power contacts, the positions of which are subject to a certain level of inaccuracy due to manufacturing tolerances, a person has to manually push the printed circuit boards vertically and horizontally into the contacts of the electronics housing during production. Larger plastic housings in particular have greater levels of inaccuracy due to shrinkage, collapse and warping. When inserting a printed circuit board, it is first of all necessary to introduce the tip of the signal contacts and the power contacts into the corresponding holes. Since the width of the tip is not much smaller than the diameter of the recess in the printed circuit board, particularly in the case of the smaller signal contacts, a very high level of accuracy is required for the relative positioning of the printed circuit board hole in relation to the signal contact. This high level of accuracy cannot be achieved with automated processes, which is why manual assembly is still required today.

It is therefore useful to enable the electronic housing to be fitted with a printed circuit board automatically.

BRIEF SUMMARY

An electronics housing for accommodating and making electrical contact with a printed circuit board has at least one signal contact for connection to the printed circuit board, wherein the at least one signal contact is in the form of a press-in contact. The electronics housing also has at least two power contacts for connection to the printed circuit board, wherein the at least two power contacts are in the form of press-in contacts and have a width that is greater than the width of the at least one signal contact. The at least two power contacts are longer than the at least one signal contact.

The width may be understood for example as meaning the diameter or the greatest extent of the signal contact, or the power contact, perpendicular to the axial direction thereof, for example at the position of contact with the printed circuit board. The terms signal contact and power contact may be understood as only relative reference to one another, since the power contact, due to the greater width thereof, may be used to transmit higher electrical powers than the signal contact, which may therefore be used, for example, to transmit low-power signals. However, the terms signal contact and power contact should not be construed as a restriction to these uses. The length of the signal contacts and power contacts may be interpreted as the height of the end of the contacts above a reference level, which may be oriented for example parallel to an accommodation plane of the printed circuit board and may be defined, for example, by a mounting plane in which signal contacts and power contacts are mounted in the housing.

When the printed circuit board is inserted into the electronics housing the power contacts, due to the greater length thereof, engage with the printed circuit board earlier than the signal contacts. Accordingly, the power contacts may be threaded into their corresponding holes in the printed circuit board. Since the wider power contacts may be introduced into likewise wider holes, a lower level of accuracy is required for the relative positioning of the power contacts in relation to one another. Due to the lower accuracy required relative to the signal contacts, the process of aligning and receiving the power contacts may also be carried out in automated fashion by way of a robot or the like. By introducing the wide power contacts into the associated holes in the printed circuit board, the power contacts are centered on the holes, which calibrates out the robot feed tolerances. Accordingly, the printed circuit board is also positioned more accurately with respect to the electronics housing. The positioning errors of the power contacts and the signal contacts admittedly have a fairly high level of inaccuracy with regard to the absolute position, but a rather low level of inaccuracy in the relative position. That is, if two contacts (the at least two power contacts) are positioned accurately, the other contacts are also positioned more accurately with respect to their associated holes. Accordingly, the introduction of the power contacts minimizes the positioning error between the electronics housing and the printed circuit board, with the result that the accuracy is sufficient to also be able to introduce the smaller signal contacts into their smaller holes in the printed circuit board. The height difference between the power contacts and the signal contacts, according to the invention, thus enables the electronics housing to be fitted with the printed circuit board automatically.

In one embodiment, the electronics housing has a base element and an opening opposite the base element for receiving the printed circuit board into the electronics housing, wherein the at least one signal contact and the at least two power contacts are connected to the base element using a retaining region and the at least one signal contact and the at least two power contacts taper in the direction from the base element to the opening, in particular towards the end (upper end) of said contacts. The signal contacts and power contacts thus have, at an upper end, a tip that is narrower than the width of the respective contact. This simplifies the threading of the signal contact, or the power contact, into the corresponding holes in the printed circuit board.

The retaining region may be arranged at a lower end, opposite the upper end, of the at least one signal contact and/or power contact. Alternatively, the retaining region may be arranged in a central region and a plug-in contact may also be formed at a lower end, for example for connection to a cable.

Accommodation of the printed circuit board in the electronics housing is not limited to the circumstance of the edge or walls of the electronics housing protruding beyond the printed circuit board. Rather, it also includes the case of the printed circuit board being arranged higher than the edge of the housing, in which case, for example, there may be provision for an appropriate cover in order to completely enclose the printed circuit board.

In a further embodiment, the at least one signal contact and the at least two power contacts are in the form of pins and are oriented substantially parallel to one another. Accordingly, the signal contacts and power contacts may be introduced into the printed circuit board by way of simple movement in a single direction along an axial direction of the pin-shaped contacts.

In a further embodiment, the at least one signal contact and the at least two power contacts have one press-fit portion each, the press-fit portions of the at least two power contacts and the at least one signal contact being at the same height, for example the centers thereof being at the same height. The press-fit portion, for example the press-in zone thereof, may be in the form of a widening of the signal contact, or the power contact, for example in the form of a stamped eye. Alternatively, the press-in zone may comprise, for example, a stamped hole ("needle of the ear") or other configurations. The same height may be understood as meaning that the press-fit portions, for example the center thereof, are at the same distance from a reference plane defined above.

In another embodiment, the press-fit portion of the power contacts extends over a greater length than the press-fit portion of the signal contacts. This may mean that the press-fit portion of the power contacts comes into contact with the printed circuit board before the press-fit portion of the signal contacts, as a result of which further centering and orientation of the printed circuit board in relation to the electronics housing takes place.

In a further embodiment of the invention, the end of the press-fit portion of the power contacts that points in the direction of the opening is higher, that is to say closer to the opening, or further away from the base element, than the end of the signal contact that points in the direction of the opening. In other words, the plane perpendicular to the power contact and through the upper end of the press-fit portion of the power contact is not intersected by the signal contact. Accordingly, the press-fit portion of the power contacts comes into contact with the printed circuit board before the signal contact, or the signal contacts, are introduced into their corresponding holes in the printed circuit board. The further centering by way of the press-fit portion of the power contacts therefore may take place before the signal contacts are threaded in, as a result of which the positioning accuracy of the signal contacts in relation to the corresponding holes in the printed circuit board is sufficient. This ensures that, even when the electronics housing is fitted with a printed circuit board in automated fashion, no signal contact is positioned next to the hole and damage to the signal contact and/or the printed circuit board could therefore occur when the printed circuit board and the electronics housing are brought together.

In a further embodiment, the at least two power contacts are wider than 1.2 mm and the at least one signal contact is narrower than 1.2 mm. The standard sizes used are typically 1 mm for signal contacts and 1.45 mm for the power contacts, the widest point of which may be widened by approximately 0.1 mm, for example. Power contacts that are wider than 1.2 mm and that are introduced into corresponding holes in the printed circuit board allow a reliable orientation of the printed circuit board in relation to the electronics housing to be achieved, in order to also thread the signal contacts that are narrower than 1.2 mm into their corresponding narrower holes.

In a further embodiment, the tapered ends of the at least two power contacts and the at least one signal contact, that is to say the tips thereof, are of substantially the same width. The width used for the tip is typically 0.3 mm. The difference in size between the tip width and the width of the hole in the printed circuit board is available as an error tolerance during assembly and is referred to as the assembly window. If the tips of the signal contact and the power contact are of substantially the same width, the power contacts have a much larger assembly window and therefore a greater error tolerance available due to the greater width and thus the larger hole in the printed circuit board. Alternatively, the tips of the signal contact and the power contact are not of the same width, but the assembly window of the power contacts is larger than the assembly window of the signal contacts.

In a further embodiment, the at least two power contacts are arranged in opposite edge regions of the electronics housing and/or are at an interval that is greater than the greatest interval between a signal contact and a power contact of the electronics housing. Alternatively, the interval between the power contacts may be greater than half the length of the printed circuit board. The greater the interval between the power contacts, the greater the accuracy of the angle between the printed circuit board and the electronics housing. Accordingly, the interval ensures that the signal contacts are positioned accurately with respect to their holes in the printed circuit board.

The object is also achieved by way of an electronic unit with an electronics housing described above and a printed circuit board. The printed circuit board has multiple holes that are each associated with the signal contacts and the power contacts and are arranged in such a way that the signal contacts and the power contacts are simultaneously accommodated in the associated holes when the printed circuit board is accommodated in the electronics housing, the holes for the longer power contacts being larger than the holes for the shorter signal contacts.

A method for assembling an above electronic unit comprises, for example by way of a method for inserting a printed circuit board into an electronics housing, comprising the steps of: taking a camera shot of the at least two power contacts of the electronics housing. This may be accomplished by virtue of the electronics housing, in which a printed circuit board has not yet been inserted, being photographed from above using the camera. A suitable arrangement of the lighting allows the tips of the power contacts to be detected by the camera with a high level of contrast. This makes it easy to determine the positions of the at least two power contacts, for example the positions of the tips thereof, from the camera shot in a next step. If there are multiple power contacts, the positions thereof may be arithmetically averaged to improve accuracy. Next, a robot arm is used to orient the printed circuit board horizontally, that is, for example, translationally in both directions of the plane and/or with respect to a rotation in the plane, so that the holes in the printed circuit board for the power contacts are opposite the positions of the associated power contacts. Now, in a next step, a vertical movement of the printed circuit board in relation to the electronics housing may be used to introduce the power contacts into the provided holes in the printed circuit board, a horizontal relative movement of the printed circuit board in relation to the electronics housing being permitted in the printed circuit board plane.

A robot arm may be understood as meaning any type of manipulator that allows a relative movement of the printed circuit board in relation to the electronics housing in the three spatial directions.

In order to permit a horizontal relative movement of the printed circuit board in relation to the electronics housing when the printed circuit board is introduced vertically into the electronics housing, the printed circuit board may, for example, be held in the robot arm in spring-loaded fashion and/or the electronics housing may be held in spring-loaded fashion. Alternatively, the electronics housing and/or the printed circuit board may not altogether be held firmly, with the result that when the printed circuit board is inserted into the electronics housing, static friction is overcome and the relative position between the printed circuit board and the electronics housing is adjusted. In other words, the printed circuit board and/or the electronics housing slip into the correct relative position.

Thereafter, the printed circuit board may be introduced into the electronics housing further by way of a further vertical relative movement, the signal contacts also being introduced into their associated holes. As a result of the printed circuit board being oriented in relation to the electronics housing when the power contacts are introduced, the signal contacts are also arranged under the associated holes in the printed circuit board with accuracy.

The automatic fitting of the electronics housing with a printed circuit board allows costs to be saved and the production time shortened.

Further features, advantages and possible applications of the invention also result from the description of exemplary embodiments that follows and the drawing. All of the features described and/or pictorially depicted belong to the subject matter of the invention both individually and in any combination, also independently of their summarization in the claims.

BRIEF DESCRIPTION OF THE DRAWINGS

The present disclosure will become more fully understood from the detailed description and the accompanying drawings, wherein:

FIG. 3 shows a sectional view of a detail from an electronic unit shortly before the printed circuit board is inserted;

FIGS. 4a and 4b show the assembly windows;

DETAILED DESCRIPTION

Figure 1:
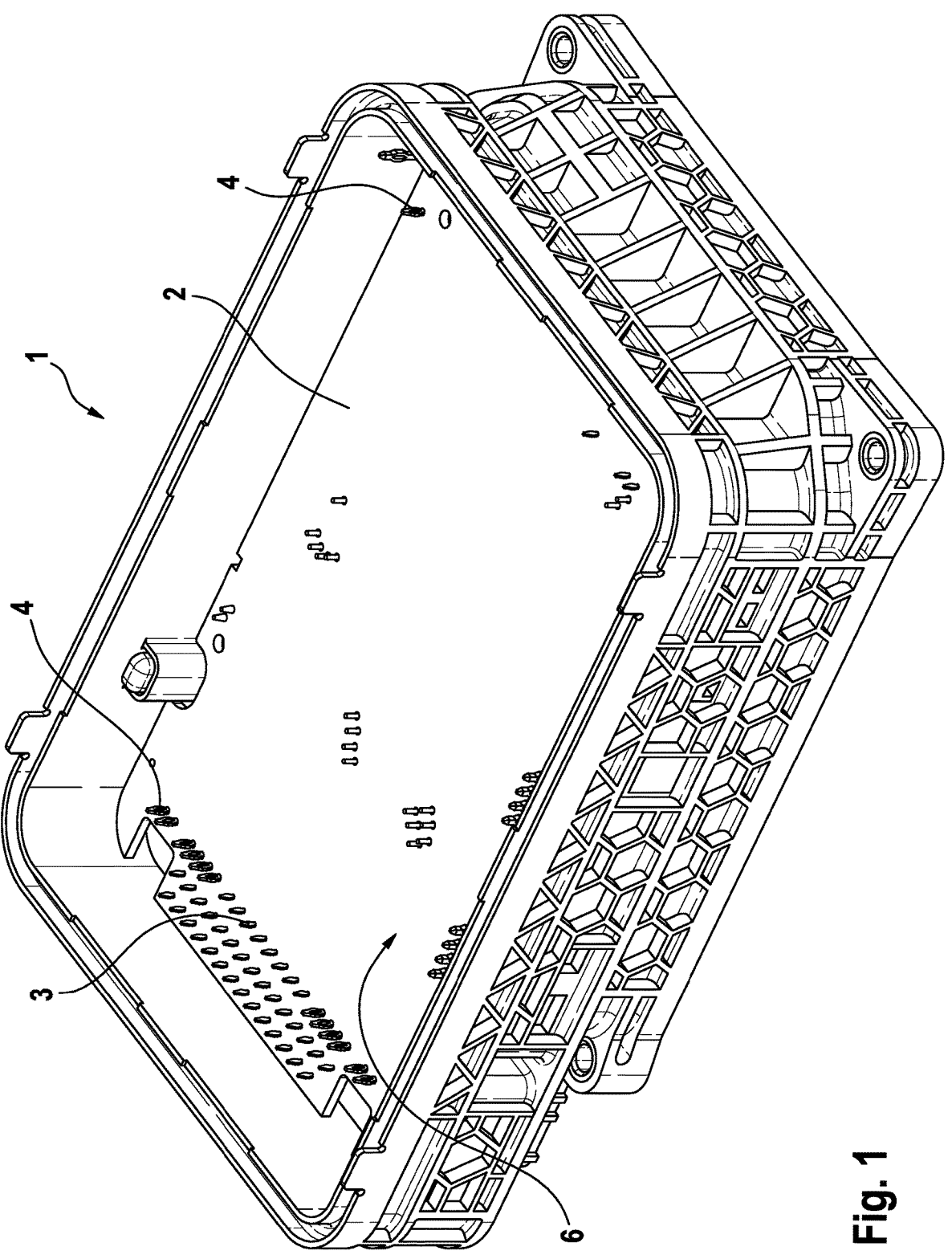
FIG. 1 shows an oblique plan view of an electronic unit.

FIG. 1 shows an electronic unit consisting of an electronics housing 1 with a printed circuit board 2 inserted therein. The electronics housing 1 has an opening 6 on an upper side, through which the printed circuit board 2 has been inserted into the electronics housing 1. The printed circuit board 2 has multiple holes 18, 20 provided in it, through which multiple electrical contacts, signal contacts 3 and power contacts 4, of the electronics housing 1 project. The power contacts 4 are arranged at multiple ends of the electronics housing 1 and accordingly also at the edge of the printed circuit board 2.

Figure 2:
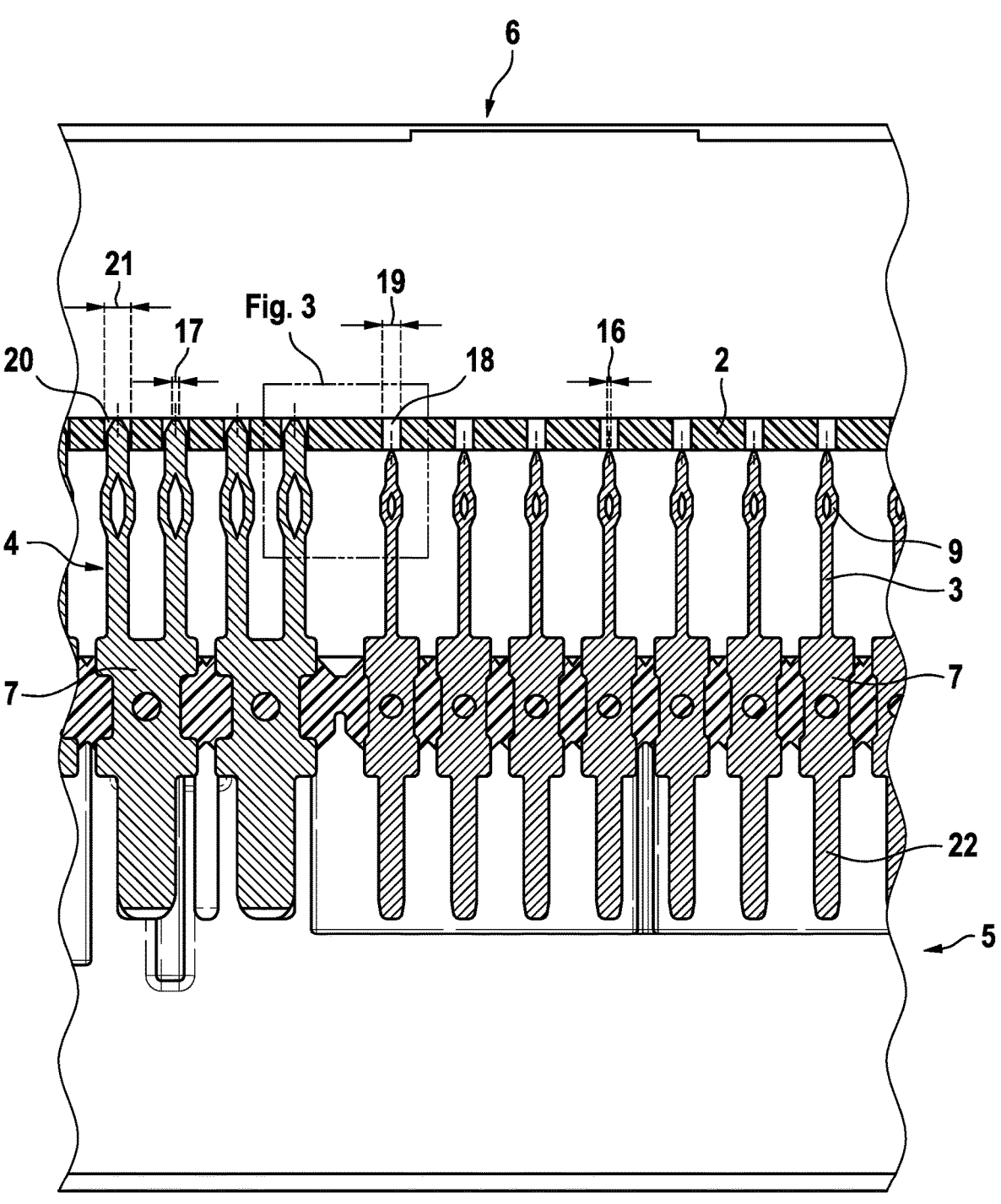
FIG. 2 shows a sectional view through an electronic unit when the printed circuit board is being inserted.

FIG. 2 shows a sectional view through the electronic unit 1 from FIG. 1, in which the design of the electronic unit may be seen in more detail. The electronics housing 1 has a base element 5 on its underside, said base element being opposite the opening 6. The power contacts 4 and the signal contacts 3 are each fixed in the electronics housing 1 by means of a retaining region 7. Below the retaining region 7, in the direction of the base element 5, the power contacts 4 and the signal contacts 3 have a plug-in contact 20 for connection to a cable. Both the signal contacts 3 and the power contacts 4 have a press-fit portion 9, which is in the form of a stamped eye, the press-fit portions of the signal contacts 3 and the power contacts 4 being situated on a common plane oriented parallel to the base element 5. FIG. 2 shows a state in which the printed circuit board 2 has already been threaded into the power contacts 4.

FIG. 3 shows a detail from FIG. 2 before the power contacts 4 are introduced into the printed circuit board 2. The printed circuit board 2, with its holes 18 for the signal contacts 3 and the holes 20 for the power contacts 4, has already been oriented with respect to the electronics housing 1 containing the signal contacts 3 and the power contacts 4 as well as possible by means of automated methods. However, as can be seen in FIG. 3, this level of accuracy is not sufficient for trouble-free introduction of the signal contact 3. The center of the signal contact 3, which is illustrated by a dashed line, is situated slightly next to the associated hole 18 in the printed circuit board 2. If an attempt were to be made to move the printed circuit board 2 towards the electronics housing 1 containing the signal contact 3, the signal contact 3 would hit the printed circuit board 2 and the signal contact 3 and/or the printed circuit board 2 would be damaged as a result. It would not be possible to introduce the printed circuit board 2 into the electronics housing 1. However, the power contacts 4 are longer than the signal contact 3. Due to the greater width of the power contact 4, the accuracy of the orientation of the printed circuit board 2 in relation to the electronics housing 1 is sufficient, with the result that the central axis of the power contact 4 already runs through the associated hole 20 in the printed circuit board 2.

This is illustrated again in FIGS. 4a and 4b. FIG. 4a shows a schematic view of the hole 18 for the signal contact 3 and the underlying tip of the signal contact 3. The tip of the signal contact 3 has a diameter 17 of approximately 0.3 mm. Since the hole 18 for the signal contact 3 has a diameter of approximately 1 mm, there is an error tolerance of approximately 0.7 mm, which is referred to as the assembly window 23.

However, the available accuracy of the horizontal orientation between the printed circuit board 2 and the electronics housing 1 is not sufficient at present to ensure with a high level of process reliability that the signal contact 3 is threaded in with an assembly window 23 of 0.7 mm.

FIG. 4*b* shows a corresponding depiction for the power contact 4. The tip of the power contact 4 has a diameter 16, which is also 0.3 mm wide. Since the hole 20 for the power contact 4 is 1.45 mm wide, an assembly window 23 of 1.15 mm is now available. The available orientation accuracy is now sufficient to ensure threading in with an assembly window 23 of 1.15 mm.

If the printed circuit board 2, starting from the state as shown in FIG. 3, is moved towards the electronics housing 1 containing the power contact 4, the taper 8 of the power contact 4 hits the edge of the associated hole 20 in the printed circuit board 2. Since a relative movement between the printed circuit board 2 and the electronics housing 1 is permitted when the power contact 4 is threaded into the printed circuit board 2, the printed circuit board is oriented with respect to the electronics housing 1 as a result of the power contact 4 being threaded into the holes 20.

Figures 5, 6:
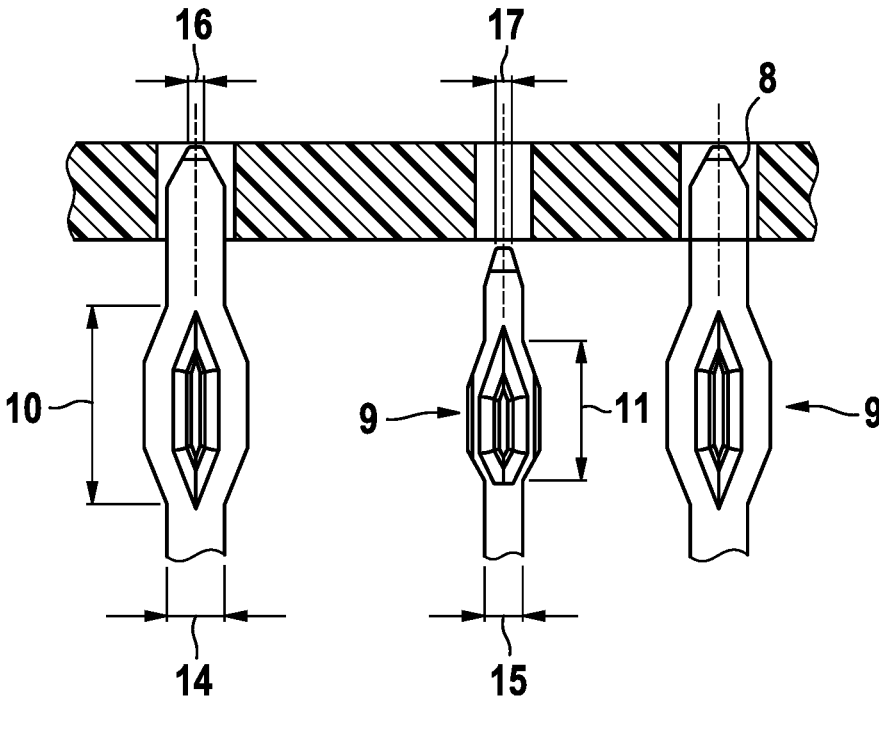
FIG. 5 shows a sectional view of a detail from an electronic unit when the printed circuit board is being inserted.
FIG. 6 shows a sectional view of a detail from a further embodiment.

This state is shown in FIG. 5. As a result of the power contact 4 being threaded in, the signal contact 3 is now also centered under its associated hole 18. If the printed circuit board 2 is moved further towards the electronics housing 1 containing the power contacts 4 and the signal contacts 3, the press-fit portions 9 of the signal contact 3 and the power contact 4 are next introduced into the associated holes 18 and 20 in the printed circuit board 2. The length 10 of the press-fit portion 9 of the power contact 4 is greater than the length 11 of the press-fit portion 9 of the signal contact 3, which means that even when the printed circuit board 2 and the electronics housing 1 are brought together further, the press-fit portion 9 of the power contact comes into contact with the printed circuit board 2 and its associated hole 20 first, resulting in further centering taking place there. Only then does the press-fit portion 9 of the signal contact 3 meet its associated hole 18, which means that the printed circuit board 2 of the electronics housing 1 can be assembled smoothly. FIG. 5 also shows the width 14 of the power contact 4, which is wider than the width 15 of the signal contact 3. The width 14 of the power contact 4 is approximately 1.45 mm and the width 15 of the signal contact 3 is approximately 1 mm.

FIG. 6 shows an alternative embodiment in which the press-fit portion 9 of the power contacts 4 has been lengthened excessively. The upper end of the press-fit portion 9 of the power contact 4 is at a height 12 that is above a plane 13 marking the end of the signal contacts 3. Thus, before the signal contacts 3 penetrate the corresponding holes 18, not only is centering performed as a result of the tip of the power contacts 4 penetrating the holes 20 in the printed circuit board 2, but also further centering occurs by way of the press-fit portion 9 of the power contacts 4. It is thus possible to also introduce particularly small signal contacts 3 into their corresponding small holes 18 in the printed circuit board 2.

The greater length of the power contacts 4, thus, allows the electronics housing 1 to be fitted with a printed circuit board 2 automatically.

The invention claimed is:

1. An electronics housing for accommodating and making electrical contact with a printed circuit board comprising:
   at least one signal contact for connection to the printed circuit board, wherein the contact is a press-in contact;
   at least two power contacts for connection to the printed circuit board, wherein the at least two power contacts are each a press-in contact with a width that is greater than a width of the at least one signal contact and a length longer than a length of the at least one signal contact, wherein a press-in portion of each of the at least two power contacts comes into contact with the printed circuit board before the at least one signal contact is introduced into an at least one hole defined by the printed circuit board;
   wherein the at least one signal contact and the at least two power contacts each have a press-fit portion, wherein a center of the press-fit portions are at the same height as one another; and
   wherein the press-fit portions of the at least two power contact extend over a greater length than the press-fit portion of the signal contacts.

2. The electronics housing as claimed in claim 1, further comprising:
   a base element
   an opening defined by the housing opposite the base element for receiving the printed circuit board;
   a retaining region, wherein the at least one signal contact and the at least two power contacts are connected to the base element in the retaining region; and
   wherein the at least one signal contact and the at least two power contacts taper in the direction from the base element toward the opening.

3. The electronics housing as claimed in claim 2, wherein the at least one signal contact and the at least two power contacts taper towards the end of the contacts.

4. The electronics housing as claimed in claim 1, wherein the at least one signal contact and the at least two power contacts are pin-shaped and are oriented parallel to one another.

5. The electronics housing as claimed in claim 1, wherein an end the power contacts that points in the direction of the opening is higher than the end of the signal contact that points in the direction of the opening.

6. The electronics housing as claimed in claim 1, wherein the at least two power contacts are wider than 1.2 mm and the at least one signal contact is narrower than 1.2 mm.

7. The electronics housing as claimed in claim 2, wherein tapered ends of the at least two power contacts and the at least one signal contact are the same width.

8. The electronics housing as claimed in claim 1, wherein the at least two power contacts are arranged in at least one of: opposite edge regions of the electronics housing and at an interval that is greater than the greatest interval between a signal contact and a power contact of the electronics housing.

9. The electronics housing as claimed in claim 1, further comprising a printed circuit board; wherein the at least one hole defined by the printed circuit board are a plurality of holes that are each associated with a respective one of the at least one the signal contacts and the at least two power contacts such that the signal contact and the power contacts are simultaneously received in the respective one of the plurality of holes when the printed circuit board is assembled in the electronics housing, wherein the respective ones of the plurality of holes which receive the longer power contacts are larger than the respective ones of the plurality of holes which receive the shorter signal contacts.

10. A method for assembling an electronic unit comprising:
   determining positions of the at least two power contacts of an electronic housing;
   orienting a printed circuit board horizontally such that holes defined by the printed circuit board for receiving the power contacts are opposite to the power contacts;

moving the power contacts vertically into the holes defined by the printed circuit board;

permitting a relative horizontal movement of the printed circuit board in relation to the electronics housing in a plane defined by the longitudinal axis of the printed circuit board, wherein the at least one signal contact and the at least two power contacts each have a press-fit portion, wherein a center of the press-fit portions are at the same height as one another; and contacting the printed circuit board with the press-fit portions of the at least two power contacts before contacting the press-fit portion of the at least one signal contact.

11. The method of claim 10, further comprising contacting the printed circuit board with the at least two power contacts prior to at least one signal contact being introduced into the holes defined by the printed circuit board.

\* \* \* \* \*